United States Patent
Xu et al.

(10) Patent No.: US 12,058,880 B2
(45) Date of Patent: Aug. 6, 2024

(54) DISPLAY SUBSTRATE, MANUFACTURING METHOD THEREOF AND DISPLAY PANEL

(71) Applicant: BOE Technology Group Co., Ltd., Beijing (CN)

(72) Inventors: Pan Xu, Beijing (CN); Yicheng Lin, Beijing (CN); Ling Wang, Beijing (CN); Guoying Wang, Beijing (CN); Ying Han, Beijing (CN); Xing Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 494 days.

(21) Appl. No.: 17/297,088

(22) PCT Filed: Oct. 22, 2020

(86) PCT No.: PCT/CN2020/122624
§ 371 (c)(1),
(2) Date: May 26, 2021

(87) PCT Pub. No.: WO2021/078175
PCT Pub. Date: Apr. 29, 2021

(65) Prior Publication Data
US 2022/0037615 A1    Feb. 3, 2022

(30) Foreign Application Priority Data
Oct. 24, 2019   (CN) .......................... 201911019818.7

(51) Int. Cl.
  *H10K 50/824*   (2023.01)
  *H10K 50/844*   (2023.01)
  (Continued)

(52) U.S. Cl.
  CPC ......... *H10K 50/824* (2023.02); *H10K 50/844* (2023.02); *H10K 71/00* (2023.02); *H10K 59/122* (2023.02); *H10K 2102/3026* (2023.02)

(58) Field of Classification Search
  CPC .... H10K 50/824; H10K 50/844; H10K 71/00; H10K 59/122; H10K 2102/3026;
  (Continued)

(56) References Cited

U.S. PATENT DOCUMENTS

| 2005/0012454 A1 | 1/2005 | Yamazaki et al. |
| 2007/0108899 A1 | 5/2007 | Jung et al. |

(Continued)

FOREIGN PATENT DOCUMENTS

| CN | 1967864 A | 5/2007 |
| CN | 101728419 A | 6/2010 |

(Continued)

OTHER PUBLICATIONS

Extended European Search Report dated Nov. 11, 2022, issued in counterpart EP Application No. 20879238.2. (9 pages).

(Continued)

*Primary Examiner* — Jonathan Han
(74) *Attorney, Agent, or Firm* — WHDA, LLP

(57) ABSTRACT

A display substrate, a manufacturing method thereof, and a display panel. The display substrate includes a base, a first electrode, a first auxiliary cathode, a second electrode and a second auxiliary cathode, a pixel definition layer and a cathode. The first and second electrodes are located in the display area and the first and second auxiliary cathodes are located in the non-emitting area. The orthogonal projections of the first auxiliary cathode and the second auxiliary cathode on the base are in a mesh structure. The pixel definition layer is at least located in the non-emitting area. The cathode at least covers the display area and the cathode (Continued)

is arranged on one side of the pixel definition layer far away from the base; wherein the cathode, the first auxiliary cathode and the second auxiliary cathode are electrically connected.

16 Claims, 10 Drawing Sheets

(51) Int. Cl.
*H10K 59/122* (2023.01)
*H10K 71/00* (2023.01)
*H10K 102/00* (2023.01)

(58) Field of Classification Search
CPC ........... H10K 59/1201; H10K 50/8426; H10K 50/8428; H10K 50/865; H10K 59/1315; H10K 59/35; H10K 59/38; H10K 59/1213; H10K 59/123; G09G 2300/0408; G09G 2300/0426; G09G 3/3266
See application file for complete search history.

(56) References Cited

U.S. PATENT DOCUMENTS

| | | |
|---|---|---|
| 2010/0097295 A1 | 4/2010 | Kwak |
| 2010/0156273 A1* | 6/2010 | Utsunomiya ...... H10K 59/1315 445/24 |
| 2014/0346448 A1 | 11/2014 | You et al. |
| 2015/0144922 A1* | 5/2015 | Moon ................. H10K 59/131 257/40 |
| 2017/0069705 A1 | 3/2017 | Cao |
| 2017/0149012 A1 | 5/2017 | Li |
| 2018/0006106 A1 | 1/2018 | Oh et al. |
| 2018/0019434 A1 | 1/2018 | Park et al. |
| 2018/0090554 A1 | 3/2018 | Choi |
| 2019/0067396 A1 | 2/2019 | Cheng et al. |
| 2020/0176541 A1 | 6/2020 | Xu et al. |
| 2020/0343278 A1 | 10/2020 | Fang et al. |
| 2021/0012723 A1 | 1/2021 | Shi et al. |
| 2021/0257581 A1 | 8/2021 | Wang et al. |

FOREIGN PATENT DOCUMENTS

| | | |
|---|---|---|
| CN | 204179115 U | 2/2015 |
| CN | 104882463 A | 9/2015 |
| CN | 106098739 A | 11/2016 |
| CN | 107634147 A | 1/2018 |
| CN | 107886902 A | 4/2018 |
| CN | 108336107 A | 7/2018 |
| CN | 108511506 A | 9/2018 |
| CN | 109742106 A | 5/2019 |
| CN | 110024157 A | 7/2019 |
| CN | 209148998 U | 7/2019 |
| CN | 110085648 A | 8/2019 |
| CN | 110148599 A | 8/2019 |
| CN | 110739338 A | 1/2020 |
| WO | 2020/177028 A1 | 9/2020 |

OTHER PUBLICATIONS

Office Action dated Jul. 27, 2021, issued in counterpart CN Application No. 201911019818.7, with English Machine Translation. (22 pages).

Search Report dated Jul. 13, 2021, issued in counterpart CN Application No. 201911019818.7, with English Machine Translation. (5 pages).

* cited by examiner

DISPLAY SUBSTRATE, MANUFACTURING METHOD THEREOF AND DISPLAY PANEL

CROSS REFERENCE TO RELEVANT APPLICATIONS

This application claims the priority of the Chinese patent application filed on Oct. 24, 2019 before the Chinese Patent Office with the application number of 201911019818.7, which is incorporated herein in its entirety by reference.

TECHNICAL FIELD

The disclosure relates to the technical field of display, and particularly relates to a display substrate, a manufacturing method thereof, and a display panel.

BACKGROUND

Organic Light-Emitting Diode (OLED) display panels have the advantages of self-luminescence, all-solid-state, high contrast and the like, and have become the most potential display panels in recent years.

OLED display panels include a bottom-emitting type and a top-emitting type, and the top-emitting type has a great advantage due to a high aperture ratio thereof. A top-emitting OLED display panel manufactured by a printing technology has the advantages of long service life, high PPI, less process flow, and the like.

SUMMARY

Embodiments of the present disclosure provide a display substrate, including a display area and a non-display area surrounding the display area surrounding the display area, the display area including an emitting area and a non-emitting area, wherein the display substrate includes:
  a base;
  a first electrode and a first auxiliary cathode arranged on the same layer of the base and spaced apart from each other, wherein the first electrode is located in the display area and the first auxiliary cathode is located in the non-emitting area;
  a second electrode and a second auxiliary cathode arranged on the same layer and spaced apart from each other, and the second electrode and the second auxiliary cathode are arranged at sides of the first electrode and the first auxiliary electrode far away from the base, wherein the second electrode is located in the display area, the second auxiliary cathode is located in the non-emitting area, and orthogonal projections of the first auxiliary cathode and the second auxiliary cathode on the base are in a mesh structure;
  a pixel definition layer, wherein the pixel definition layer is at least located in the non-emitting area, wherein the pixel definition layer is arranged on sides of the second electrode and the second auxiliary cathode far away from the base; and
  a cathode, wherein the cathode at least covers the display area and the cathode is arranged on one side of the pixel definition layer far away from the base;
  wherein the cathode, the first auxiliary cathode and the second auxiliary cathode are electrically connected.

In some embodiments, the first auxiliary cathode includes a plurality of first auxiliary cathode lines parallel to each other and extending along a first direction, and the second auxiliary cathode includes a plurality of second auxiliary cathode lines parallel to each other and extending along a second direction, and the first direction intersects with the second direction.

In some embodiments, the first direction is perpendicular to the second direction.

In some embodiments, the display substrate further includes a protective layer, wherein the protective layer is at least located in the non-emitting area, and the protective layer is arranged between the first auxiliary cathode and the second auxiliary cathode, the protective layer is provided with a plurality of protective layer via holes in overlapped areas of the plurality of first auxiliary cathode lines and the plurality of second auxiliary cathode lines, and the plurality of first auxiliary cathode lines are electrically connected to the plurality of second auxiliary cathode lines through the plurality of protective layer via holes.

In some embodiments, the pixel definition layer includes a plurality of first pixel definition layer openings, orthographic projections of the plurality of first pixel definition layer openings on the base fall into an orthographic projection of the second auxiliary cathode on the base, and the cathode is in contact with the second auxiliary cathode lines through the plurality of first pixel definition layer openings.

In some embodiments, the first electrode is located in the display area, and the first electrode is located in a source-drain electrode layer; and the second electrode is located in the emitting area, and the second electrode is an anode.

In some embodiments, the display substrate further includes a power line, wherein the power line, the first electrode and the first auxiliary cathode are arranged on the same layer, and the power line and the first auxiliary cathode are spaced apart from each other.

In some embodiments, the second electrode is located in the display area, and the second electrode is located in a source-drain electrode layer; and the first electrode is located in the non-emitting area, and the first electrode is a grid line.

In some embodiments, the protective layer includes an insulating sub-layer and a flat sub-layer arranged far away from the base in sequence.

In some embodiments, the display substrate further includes:
  a power supply electrode arranged on the base and located in the non-display area, wherein the power supply electrode is configured for supplying power to the cathode; and
  an inter level dielectric, a third auxiliary cathode, an isolating layer and a fourth auxiliary cathode arranged above the power supply electrode, wherein the power supply electrode, the inter level dielectric, the third auxiliary cathode, the isolating layer and the fourth auxiliary cathode are arranged away far away from the base in sequence, both the third auxiliary cathode and the fourth auxiliary cathode are located in the non-display area,
  wherein the power supply electrode is electrically connected to the cathode electrode through the third auxiliary cathode and the fourth auxiliary cathode,
  wherein the third auxiliary cathode and the first auxiliary cathode are arranged on the same layer, and the fourth auxiliary cathode and the second auxiliary cathode are arranged on the same layer.

In some embodiments, the pixel definition layer is provided with a second pixel definition layer opening, an orthogonal projection of the second pixel definition layer opening on the base falls into an orthogonal projection of the fourth auxiliary cathode on the base, the isolating layer is provided with an isolating layer via hole penetrating the isolating layer, the inter level dielectric is provided with an inter level dielectric via hole penetrating the inter level dielectric, and the cathode is in direct contact with the fourth auxiliary cathode through the second pixel definition layer opening; the fourth auxiliary cathode is electrically connected to the third auxiliary cathode through the isolating layer via hole; and the third auxiliary cathode is electrically connected to the power supply electrode through the inter level dielectric via hole.

In some embodiments, the display substrate further includes a power line, wherein the power line, the first electrode and the first auxiliary cathode are arranged on the same layer, and the power line and the first auxiliary cathode are spaced apart from each other; and the power line extends from the display area to the non-display area, the power line and the third auxiliary cathode are arranged on the same layer and spaced apart from each other, and orthographic projections of the power line and the fourth auxiliary cathode on the base do not overlap with each other.

In some embodiments, the display substrate further includes a protective layer, wherein the protective layer is at least located in the non-emitting area, and the protective layer is arranged between the first auxiliary cathode and the second auxiliary cathode; and the isolating layer and the protective layer are arranged on the same layer.

In some embodiments, the isolating layer includes a first isolating sub-layer and a second isolating sub-layer, and the protective layer includes an insulation layer and a flat sub-layer.

In some embodiments, the first isolating sub-layer is arranged on the same layer with the flat sub-layer, the second isolating sub-layer is arranged on the same layer with the insulation sub-layer.

Some embodiments of the present disclosure provide a display panel including the display substrate according to the forgoing embodiments.

Some embodiments of the present disclosure provide a manufacturing method of a display substrate, wherein the display substrate is divided into a display area and a non-display area surrounding the display area, the display area includes an emitting area and a non-emitting area, and the manufacturing method of the display substrate includes:

forming a first electrode and a first auxiliary cathode spaced apart from each other on a base through a single patterning process, wherein the first electrode is located in the display area and the first auxiliary cathode is located in the non-emitting area; forming a second electrode and a second auxiliary cathode spaced apart from each other through a single patterning process, wherein the second electrode and the second auxiliary cathode are formed on sides of the first electrode and the first auxiliary electrode far away from the base, the second electrode is located in the display area, and the second auxiliary cathode is located in the non-emitting area; and projections of the first auxiliary cathode and the second auxiliary cathode on the base are in a mesh structure; forming a pixel definition layer on sides of the second electrode and the second auxiliary cathode far away from the base, wherein the pixel definition layer is at least located in the non-emitting area; forming a cathode on one side of the pixel definition layer far away from the base, wherein the cathode at least covers the display area, and the cathode, the first auxiliary cathode and the second auxiliary cathode are electrically connected.

In some embodiments, the step of, forming the first electrode and the first auxiliary cathode spaced apart from each other on the base through the single patterning process includes: forming the first electrode and the first auxiliary cathode spaced apart from each other on the base through a printing process.

In some embodiments, the step of, forming the second electrode and the second auxiliary cathode spaced apart from each other on the base through the single patterning process includes: forming the second electrode and the second auxiliary cathode spaced apart from each other on the base through a printing process.

The above description is only an overview of the technical solution of the disclosure. In order to better understand the technical solution of this disclosure, therefore it can be implemented in accordance with the content of the specification, and in order to make the above and other purpose characteristics and advantages of this disclosure more obvious and understandable, the specific implementation method of this disclosure is presented below.

BRIEF DESCRIPTION OF THE DRAWINGS

To further clarify technical solutions in the embodiments of the present disclosure or the related art, drawings to be used in descriptions on the embodiments or the related art are briefly introduced hereinafter. Apparently, the described drawings are merely for some embodiments of the present disclosure, while other drawings can be obtained by those of ordinary skills in the art based on these drawings without going through any creative work.

DETAILED DESCRIPTION

The following clearly and completely describes the technical solutions in the embodiments of the present disclosure with reference to the drawings in the embodiments of the present disclosure. Apparently, the described embodiments are merely some but not all of the embodiments of the present disclosure. Based on the embodiments in the present disclosure, all other embodiments obtained by those of ordinary skills in the art without going through any creative work should fall within the protection scope of the present disclosure.

It should be noted that the "upper" and "lower" mentioned in the embodiments of the present disclosure are based on an order that a layer structure is formed, wherein a layer structure formed earlier is lower, and a layer structure formed later is upper. The "first" and "second" in the embodiments of the present disclosure are only used for descriptive purposes, but cannot be understood as indicating or implying relative importance, or implicitly indicating the number of indicated technical features.

A technology of printing a top-emitting OLED display panel is gradually becoming the mainstream of developing an OLED display panel. A full printing technology is one of the technologies for printing OLED display panels, which is mainly for large-size Monitor (display) or TV series. This technology means that all layers of the OLED display panel are completed by printing, and an emitting layer (EL) only exists in an emitting area.

Auxiliary cathodes are often used in large-size top-emitting OLED display panels to reduce cathode impedance and meet a voltage drop requirement needed for display. However, most of the related technologies use a newly added film to set up the auxiliary cathodes, which undoubtedly increases the complexity of the manufacturing process.

In the top-emitting OLED display panel, the cathode is made of a transparent conductive material. When current flows through the cathode, an impedance of the transparent cathode is relatively large, so a relatively large voltage drop (IR Drop) will occur. Moreover, with the increase of the size of the display panel, the voltage drop of the cathode increases significantly, resulting in uneven display brightness. Therefore, the auxiliary cathodes are often used in the large-size top-emitting OLED display panels to reduce the cathode impedance and meet the voltage drop requirement needed for display.

Figure 1:
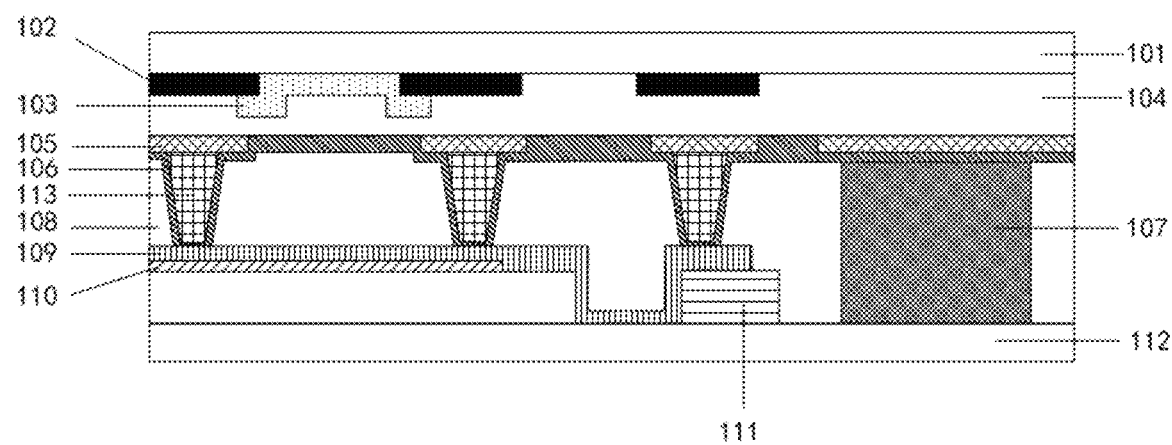
FIG. 1 is a schematic structural diagram of an OLED display panel according to the related art.

In the related art, an OLED display panel includes a cover board and a back board that are cell-aligned. The back board here refers to an OLED display substrate. As shown in FIG. 1, the cover board includes a cover plate base 101 and film layers such as a black matrix 102, a colored film layer 103, a flat layer 104, an auxiliary cathode 105, a connection electrode 106, a spacer 113 and a filling layer 108 formed on the cover board base 101, wherein the connection electrode 106, for example, is made of Indium Tin Oxide (ITO). The back board includes a back board base 112 and film layers such as a pixel definition layer 111, an emitting layer 110 and a cathode 109 formed on the back board base 112 (certainly, other structures such as an anode and a thin film transistor are also formed on the back board base), and the cover board and the back board are cell-aligned together by a border adhesive 107.

The auxiliary cathode 105 is designed on the cover board base 101, and is overlapped with the cathode 109 through the connection electrode 106, so as to reduce the cathode impedance. However, manufacturing the auxiliary cathode 105 on the cover board base 101 requires new layers, which increases the complexity of the process. Meanwhile, the overlapping mode easily causes great damage to the OLED display panel, thus improving the manufacturing difficulty.

Figure 2:
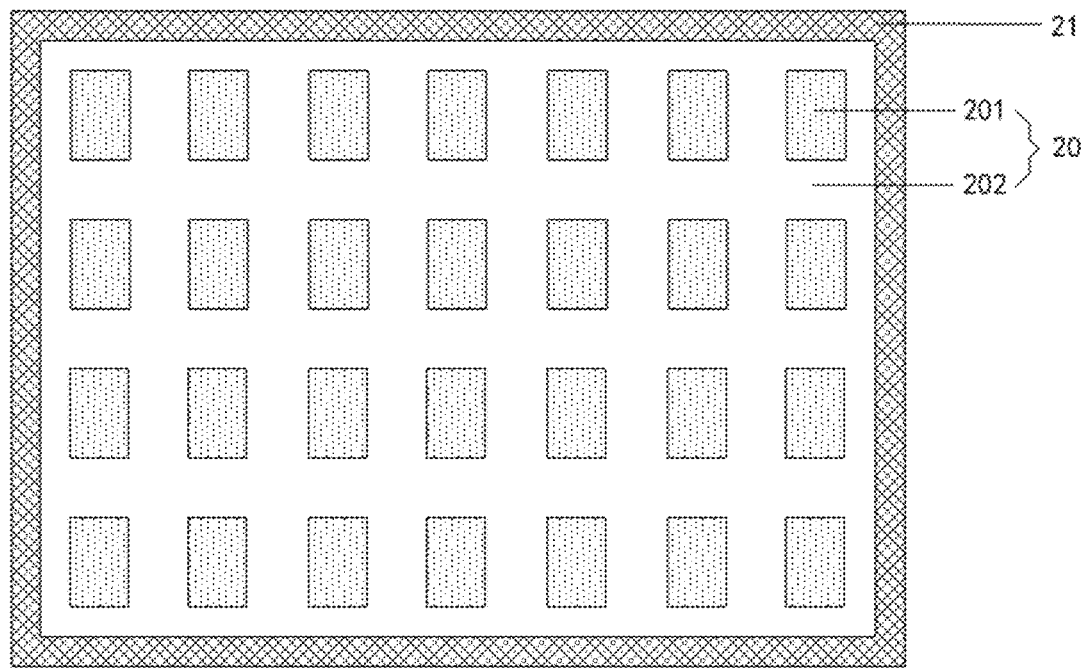
FIG. 2 is a schematic diagram showing area dividing of the display substrate.

Some embodiments of the present disclosure provide a display substrate. With reference to FIG. 2, the display substrate is divided into a display area (also referred to as Active Area, AA) 20 and a non-display area 21 surrounding the display area 20. The display area 20 includes an emitting area 201 and a non-emitting area 202.

The display area above refers to an area for realizing display; and the emitting area refers to an area where an OLED unit is arranged. According to the related art, the OLED unit includes an Anode, an organic emitting functional layer and a Cathode. The non-emitting area refers to an area in the display area except the emitting area, in which a pixel definition layer and pixel circuit wiring may be provided. The pixel circuit wiring may include a grid line, a data line, and the like.

The display substrate includes a first electrode and a first auxiliary cathode arranged on the same layer of the base and spaced apart from each other, wherein the first electrode is located in the display area and the first auxiliary cathode is located in the non-emitting area; a second electrode and a second auxiliary cathode arranged on the same layer and spaced apart from each other, wherein the second electrode is located in the display area and arranged above the first electrode, the second auxiliary cathode is located in the non-emitting area and arranged above the first auxiliary cathode, and it is to be understood that the second electrode and the second auxiliary cathode are arranged on sides of the first electrode and the first auxiliary electrode far away from the base, and orthogonal projections of the first auxiliary cathode and the second auxiliary cathode on the base of the display substrate are in a mesh structure; a pixel definition layer, wherein the pixel definition layer is located in an area other than the emitting area, for example, at least located in the non-emitting area, and arranged above the second electrode and the second auxiliary cathode; and a transparent cathode, wherein the transparent cathode at least covers the display area, for example, may cover the display area and the non-display area, and is arranged above the pixel definition layer; wherein the transparent cathode, the first auxiliary cathode and the second auxiliary cathode are electrically connected.

The arrangement of the first electrode and the first auxiliary cathode on the same layer above means that the first electrode and the first auxiliary cathode are formed by using the same material through a single patterning process, and the arrangement of being spaced apart from each other means that there is a gap between the first electrode and the first auxiliary cathode without forming an electrical path.

The first electrode above is an essential conductive structure for forming the display substrate. The first electrode may be a source/drain, a grid, an anode, and the like, and may also be a metal line, such as a grid line, a data line, and the like, and is not specifically limited here. The first electrode is located in the display area, that is, a specific area of the first electrode in the display area is not limited, and needs to be determined according to a specific structure of the first electrode. For example, if the first electrode is a data line located in the source-drain electrode layer, the first electrode may be located in the non-emitting area of the display area. If the first electrode is an anode, the first electrode may be located in the emitting area of the display area.

The first auxiliary cathode above is located in the non-emitting area, on which the pixel definition layer is arranged, that is, the first auxiliary cathode is located below the pixel definition layer. A shape and a number of the first auxiliary cathode are not limited here. The Pixel Definition Layer (PDL) above is located in the area other than the emitting area, that is, the pixel definition layer is provided with an opening at a position corresponding to the emitting area, so as to facilitate setting of the organic emitting functional layer.

The arrangement of the second electrode and the second auxiliary cathode on the same layer above means that the second electrode and the second auxiliary cathode are formed by using the same material through a single patterning process, and the arrangement of being spaced apart from each other means that there is a gap between the second electrode and the second auxiliary cathode without forming an electrical path.

The second electrode above is an essential conductive structure for forming the display substrate. The second electrode may be a source/drain, a grid, an anode, and the like, and may also be a metal line, such as a grid line, a data line, and the like, and is not specifically limited here. The second electrode is located in the display area, that is, a specific area of the second electrode in the display area is not limited, and needs to be determined according to a specific structure of the second electrode. For example, if the second electrode is an anode, the second electrode may be located in the emitting area of the display area. In this case, the first electrode may be a data line located in the source-drain electrode layer, which may be located in the non-emitting area of the display area. If the second electrode is a data line located in the source-drain electrode layer, the second electrode may be located in the non-emitting area of the display area. In this case, the first electrode may be a grid line, which may be located in the non-emitting area of the display area.

It should be noted that a shape and a number of the second auxiliary cathode are not limited here. Moreover, the transparent cathode, the first auxiliary cathode and the second auxiliary cathode are electrically connected. A specific mode of the electrical connection is not limited here.

Specific structures of the first auxiliary cathode and the second auxiliary cathode are not limited here as long as the projections of the first auxiliary cathode and the second auxiliary cathode on the base of the display substrate are in a mesh structure.

Certainly, the display substrate above further includes other structures or other film layers. For example, similar to the related art, the display substrate above further includes the base. The first electrode and the first auxiliary cathode are formed on the base. The display substrate above may further include a TFT, and the like. Only the structures or film layers related to the invention are described here, and those skilled in the art can know other structures or film layers included in the display substrate through related art and common knowledge.

The display substrate above may further include an anode. If the anode is made of an opaque material, the display substrate can be used in a top-emitting type OLED display panel, wherein the top-emitting type OLED display panel is a display panel in which light is emitted from the cathode side. If the anode is made of a transparent material, the display substrate can be used in a double-sided OLED display panel, wherein the double-sided OLED display panel is a display panel in which light is emitted from the cathode side and the anode side at the same time. Certainly, the display substrate above may also form other types of display panels, which are not limited here.

The display substrate above may be used as a back board and cell-aligned with a cover board to form a display panel. Here, a supply mode of the transparent cathode in the display substrate is not limited. For example, the display substrate above may supply power to the transparent cathode in an up-and-down supply mode, and may also supply power to the transparent cathode in a left-and-right supply mode. Certainly, other supply modes may also be adopted. Here, a pixel circuit structure and a driving mode of the transparent cathode included in the display substrate are also not limited. For example, the transparent cathode may be driven by a both-side driving mode or a single-side driving mode, which is not specifically limited here.

A manufacturing method of the display substrate above is not limited here. For example, a full-printing manner may be adopted to form each film layer.

The embodiments of the present disclosure provide the display substrate. In the display substrate, the first auxiliary cathode is located in the non-emitting area. The first auxiliary cathode and the first electrode are arranged in the same layer and spaced apart from each other, so that the first auxiliary cathode can be manufactured at the same time when the first electrode is manufactured, and a new film layer is not needed. The second auxiliary cathode is located in the non-emitting area. The second auxiliary cathode and the second electrode are arranged on the same layer and spaced apart from each other, so that the second auxiliary cathode can be manufactured at the same time when the second electrode is manufactured, and a new film layer is not needed. The transparent cathode, the first auxiliary cathode and the second auxiliary cathode are electrically connected, so that the impedance of the transparent cathode can be reduced more, thereby reducing the voltage drop more effectively and improving the display effect. The first auxiliary cathode and the second auxiliary cathode form a mesh structure, which can greatly reduce the voltage drop of the transparent cathode and greatly reduce a Cross Talk problem, thereby significantly improving the display effect and improving the product quality. In other words, the display substrate provided by the embodiments of the present disclosure can be provided with the first auxiliary cathode and the second auxiliary cathode on the premise of not adding a new film layer, which can further reduce the impedance of the transparent cathode, thereby effectively reducing the voltage drop and further improving the display effect. Meanwhile, compared with the processes in the related art, electrode layers in a back board process are adopted, and no new process layers are added, thus greatly reducing the complexity of the manufacturing process and improving the productivity.

Optionally, the display substrate above further includes a protective layer, wherein the protective layer may be at least located in the non-emitting area, and arranged between the first auxiliary cathode and the second auxiliary cathode.

Figure 3:
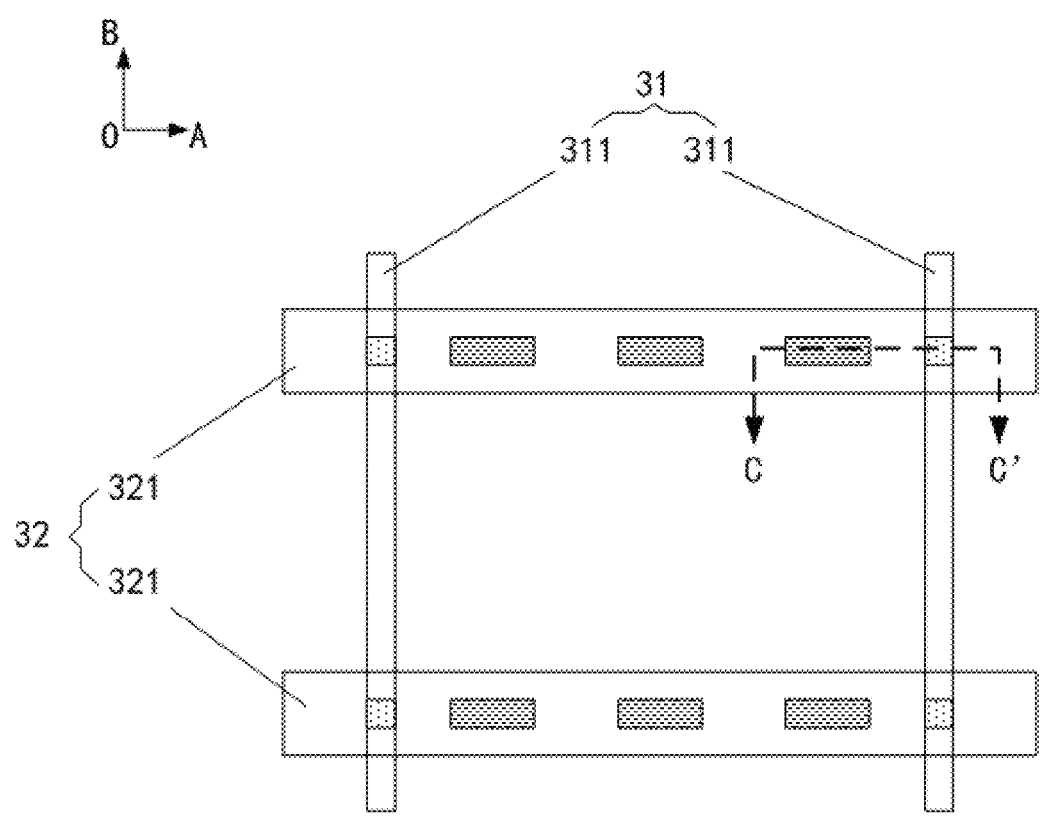
FIG. 3 is a schematic structural diagram of a first auxiliary cathode and a second auxiliary cathode according to an embodiment of the present disclosure.
Figure 8:
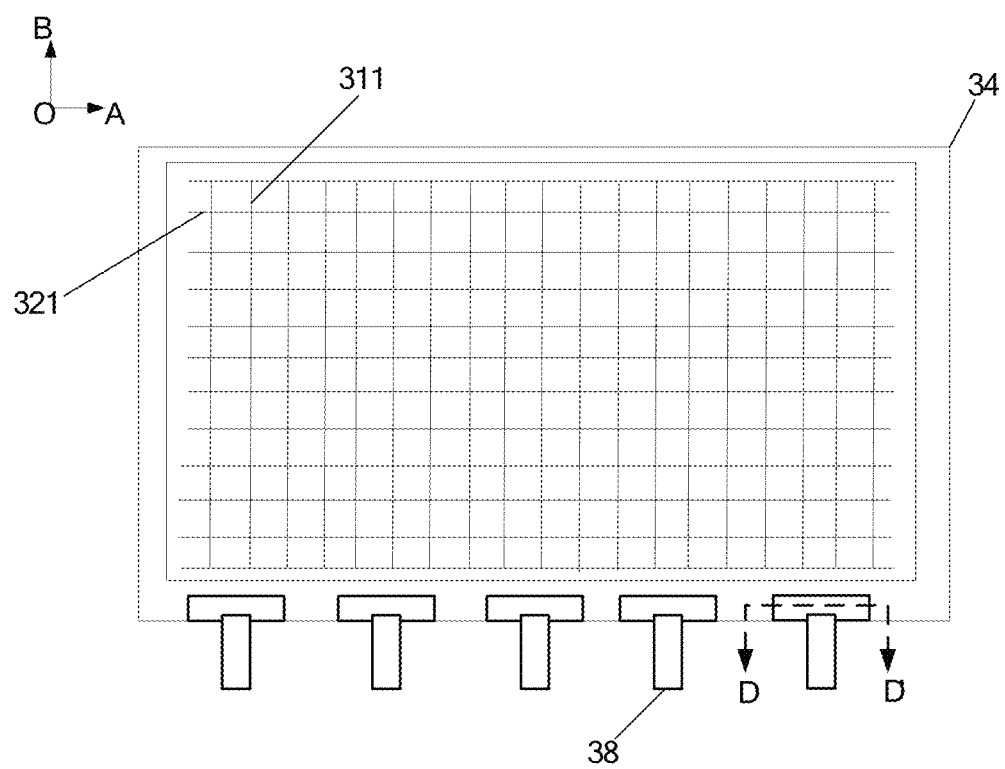
FIG. 8 is a schematic structural diagram of a display substrate according to an embodiment of the present disclosure.

Optionally, referring to FIG. 3, the first auxiliary cathode 31 includes a plurality of parallel first auxiliary cathode lines 311, wherein the plurality of first auxiliary cathode lines 311 extend along a first direction. The second auxiliary cathode 32 includes a plurality of parallel second auxiliary cathode lines 321, wherein the plurality of second auxiliary cathode lines 321 extend along a second direction. The first direction intersects with the second direction, for example, perpendicular. The orthogonal projections of the first auxiliary cathode 31 and the second auxiliary cathode 32 on the base of the display substrate are in a mesh structure. As shown in FIG. 8, projections of the plurality of parallel first auxiliary cathode lines 311 and the second auxiliary cathode lines 321 on the base of the display substrate are in a mesh structure.

The projections of the plurality of parallel first auxiliary cathode lines and the plurality of parallel second auxiliary cathode lines on the substrate of the display substrate are in a mesh structure, wherein the structure is simple to manufacture and easy to realize. Meanwhile, the structure can greatly reduce the voltage drop of the transparent cathode and greatly reduce the Cross Talk problem, thereby significantly improving the display effect and improving the product quality.

Figure 4:
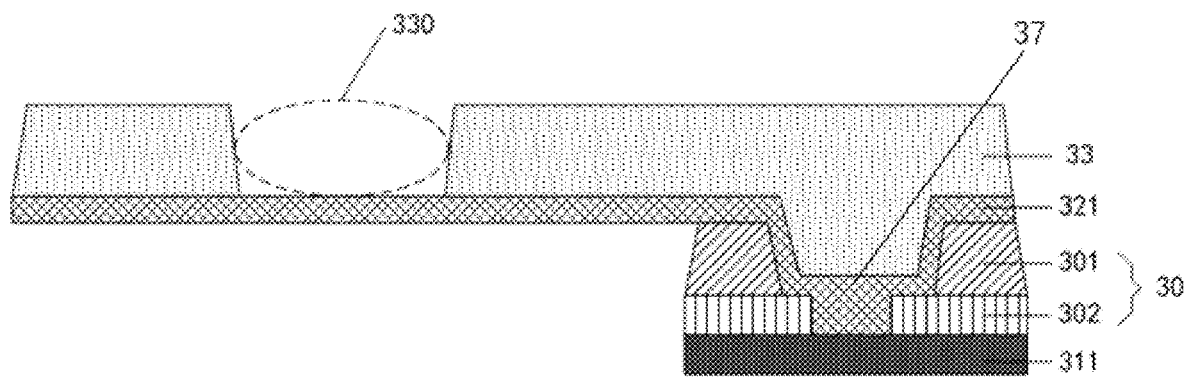
FIG. 4 is a cross-sectional view along a direction CC' in FIG. 3 without a cathode.
Figure 5:
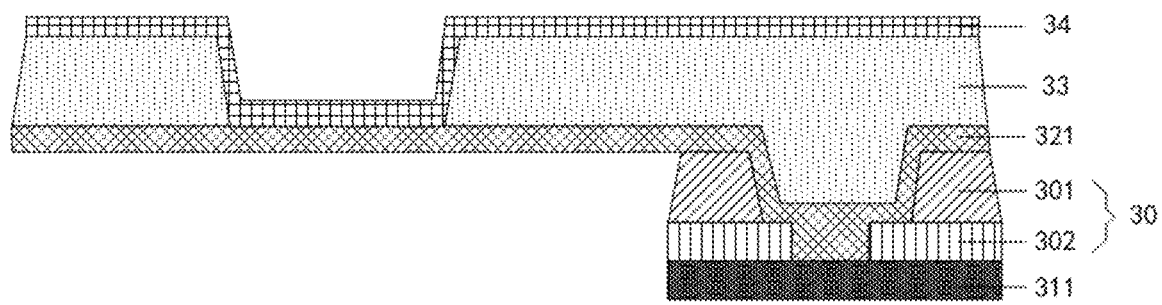
FIG. 5 is a cross-sectional view along the direction CC' in FIG. 3 after a cathode is arranged.
Figure 6:
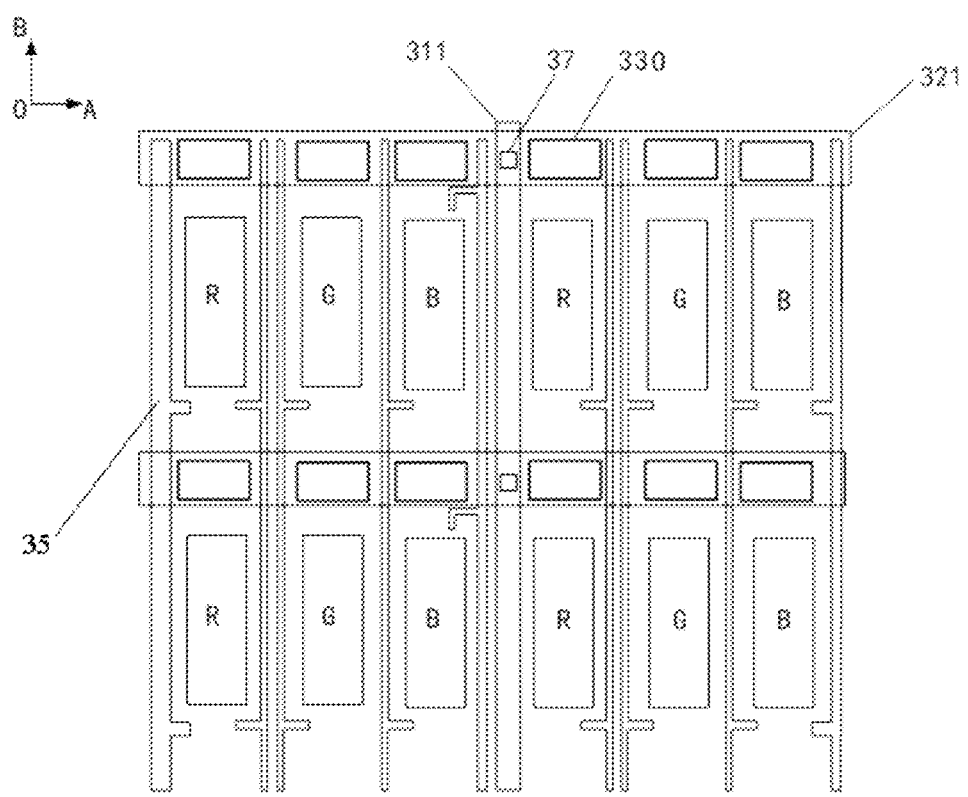
FIG. 6 is a schematic diagram showing a layout structure of a display substrate according to an embodiment of the present disclosure.

Optionally, referring to FIG. 5 and FIG. 6, the protective layer 30 is provided with a protective layer via hole 37 in an overlapped area corresponding to the first auxiliary cathode line 311 and the second auxiliary cathode line 321. The first auxiliary cathode line 311 is electrically connected to the second auxiliary cathode line 321 through the protective layer via hole 37. Referring to FIG. 4 and FIG. 6, the pixel definition layer 33 is provided with a first pixel definition layer opening 330 corresponding to an area of the second auxiliary cathode line 321 that does not overlap with the first auxiliary cathode line 321. An orthographic projection of the first pixel definition layer opening 330 on the base falls into an orthographic projection of the second auxiliary cathode on the base. Referring to FIG. 5, the transparent cathode 34 is in direct contact with the second auxiliary cathode line 321 through the first pixel definition layer opening 330. It can be understood by those skilled in the art that in FIG. 6, only rectangular frames are used to represent positions of the protective layer via hole 37 and the first pixel definition layer opening 330 in a plan view.

Here, a number and a size of the first pixel definition layer opening are not limited, and may be determined according to actual needs. In both FIG. 3 and FIG. 6, it is illustrated that the pixel definition layer is provided with three first pixel definition layer openings corresponding to the area of the second auxiliary cathode line that does not overlap with the first auxiliary cathode line.

Here, a number and a size of the protective layer via hole are not limited, and may be determined according to actual needs. In both FIG. 3 and FIG. 6, it is illustrated that the protective layer is provided with one protective layer via hole in one overlapped area corresponding to the second auxiliary cathode line and the first auxiliary cathode line.

Moreover, a number and a thickness of the protective layer are not limited here. In both FIG. 4 and FIG. 5, it is illustrated that the protective layer includes two sub-layers.

The above structure can realize the electrical connection of the first auxiliary cathode line and the second auxiliary cathode line, the electrical connection of the transparent cathode and the second auxiliary cathode line, and then the electrical connection of the transparent cathode, the first auxiliary cathode line and the second auxiliary cathode line. The structure is simple in design and easy to implement.

Optionally, if the first electrode is located in the non-emitting area, the first electrode may be a data line located in the source-drain electrode layer. If the second electrode is located in the emitting area, the second electrode may be an anode.

It should be noted that a thin film transistor includes three electrodes such as a source electrode, a drain electrode and a grid electrode. The source-drain electrode above refers to the source electrode and the drain electrode. Generally, a layer where the source-drain electrode is located is called the source-drain electrode layer (SD layer).

In this way, the first auxiliary cathode can be manufactured while manufacturing the source-drain electrode; and the second auxiliary cathode manufactured while manufacturing the anode, thereby greatly simplifying the manufacturing process and reducing the manufacturing difficulty.

Figure 7:
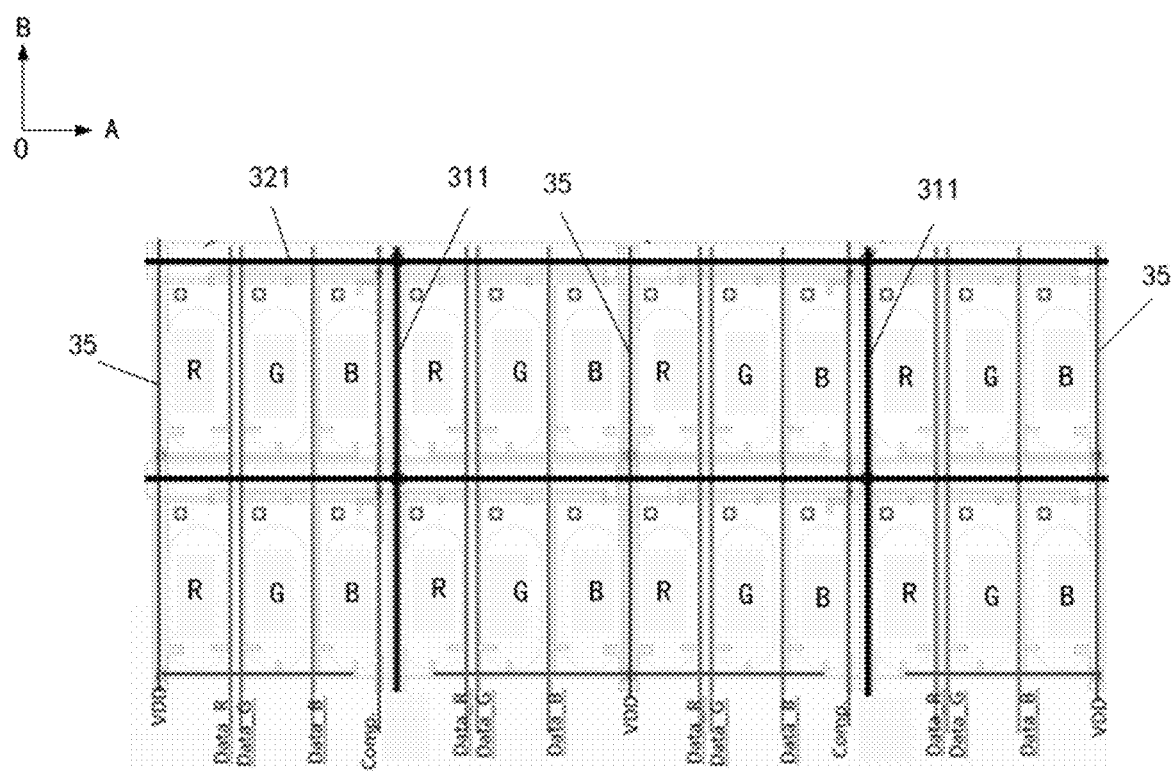
FIG. 7 is a schematic diagram showing a layout structure of a display substrate according to an embodiment of the present disclosure.

Further optionally, referring to FIG. 7, the display substrate above further includes a power line (VDD Line) 35 located in the non-emitting area. The power line, the first electrode and the first auxiliary cathode are arranged on the same layer, and the power line 35 and the first auxiliary cathode 311 are spaced apart from each other. If there is a short circuit between the first auxiliary cathode and the power line, the display panel including the display substrate may not be able to light up, and more severely, a screen may even be burnt. Therefore, the power line and the first auxiliary cathode are arranged on the same layer and spaced apart from each other. Referring to FIG. 7, the first auxiliary cathode lines 311 and the power line 35 are arranged in parallel and are far away from each other, which can basically prevent the short circuit between the first auxiliary cathode and the power line, thus greatly improving the yield rate of the display panel including the display substrate. It should be noted that FIG. 7 is a layout plan, which exemplarily shows a schematic structural diagram of a display substrate only. In FIG. 7, each pixel unit (including three sub-pixels R, G and B) is driven by the power line 35, and certainly, may also be driven in other ways in practice, and will not be repeated here. Moreover, in the drawing of the present disclosure provided with the auxiliary cathodes, the first auxiliary cathode lines are all arranged along an OB direction, i.e., the first direction, and the second auxiliary cathode lines are all arranged along an OA direction, i.e., the second direction.

Optionally, referring to FIG. 5, the protective layer 30 includes an insulating sub-layer (e.g., PVX layer) 302 and a flat sub-layer (e.g., Resin layer) 301 above the insulating sub-layer 302. A material of the flat sub-layer may be an organic material, and a thickness of the flat sub-layer may be set thicker. A material of the insulating sub-layer may be an inorganic material. In this way, the flat sub-layer and the insulating sub-layer are arranged in a middle of an over-lapped area between the power line and the second auxiliary cathode, which can effectively isolate the power line and the second auxiliary cathode, and ensure that no short circuit occurs between the power line and the second auxiliary cathode, thereby further improving the yield rate of the display panel including the display substrate.

Figure 9:
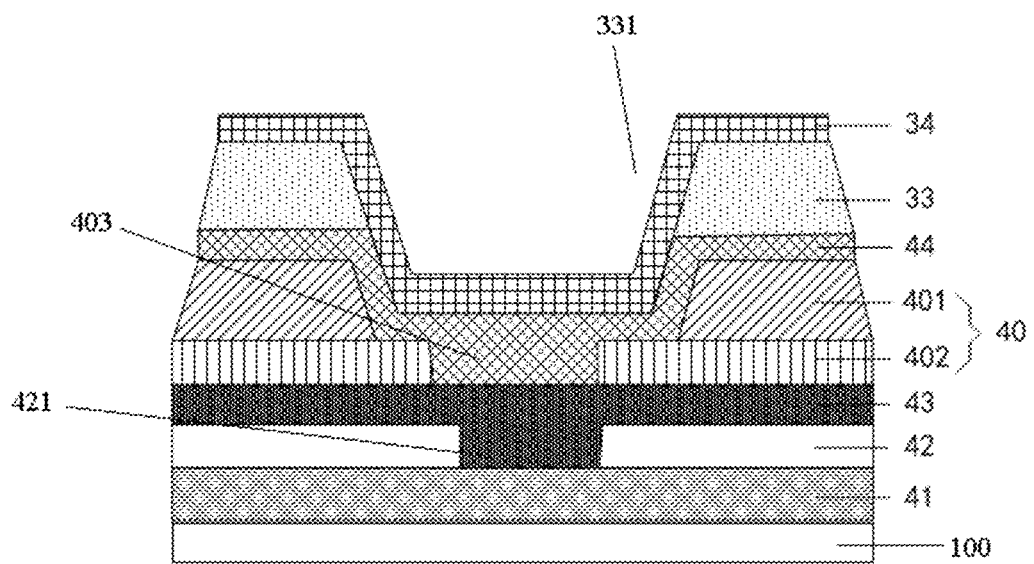
FIG. 9 is a cross-sectional view along a direction DD' in FIG. 8.

Optionally, referring to FIG. 9, the display substrate above further includes a power supply electrode 41 arranged on the base 10 and located in the non-display area, wherein the power supply electrode 41 is used for supplying power to the transparent cathode 34.

An Inter Level Dielectric (ILD) 42, a third auxiliary cathode 43, an isolating layer 40 and a fourth auxiliary cathode 44 arranged above the power supply electrode 41 are further included, wherein the third auxiliary cathode 43 and the fourth auxiliary cathode 44 are both located in the non-display area 21. It is to be understood that the power supply electrode 41, the inter level dielectric 42, the third auxiliary cathode 43, the isolating layer 40 and the fourth auxiliary cathode 44 are arranged away far the base 10 in sequence, and both the third auxiliary cathode and the fourth auxiliary cathode are located in the non-display area The pixel definition layer 33 is provided with a second pixel definition layer opening 331, an orthogonal projection of the second pixel definition layer opening 331 on the base 10 falls into an orthogonal projection of the fourth auxiliary cathode 44 on the base 10, the isolating layer 40 is provided with an isolating layer via hole 403 penetrating the isolating layer 40, and the inter level dielectric 42 is provided with an inter level dielectric via hole 421 penetrating the inter level dielectric.

The transparent cathode 34 is in direct contact with the fourth auxiliary cathode 44 through the second pixel definition layer opening 331 of the pixel definition layer 33. The fourth auxiliary cathode 44 is electrically connected to the third auxiliary cathode 43 through the isolating layer via hole 403 of the isolating layer 40. The third auxiliary cathode 43 is electrically connected to the power supply electrode 41 through the inter level dielectric via hole 421 of the inter level dielectric 42.

The third auxiliary cathode and the first auxiliary cathode are arranged on the same layer arranged on the same layer and spaced apart from each other and spaced apart from each other. The fourth auxiliary cathode and the second auxiliary cathode are arranged on the same layer and spaced apart from each other.

The power supply electrode above may be arranged in the same layer as the grid line of the display area, and certainly, may also be arranged in the same layer as other conductive film layers, and the power supply electrode may be electrically connected to an external power supply structure (Vss Power) 38 shown in FIG. 8 for supplying power to the transparent cathode. The external power supply structure 38 may be a cathode power supply chip or a power supply, and certainly, may also be other structures, which are not listed here.

The arrangement of the third auxiliary cathode and the first auxiliary cathode on the same layer above means that the third auxiliary cathode and the first auxiliary cathode are formed by using the same material through a single patterning process.

The arrangement of the fourth auxiliary cathode and the second auxiliary cathode on the same layer above means that the fourth auxiliary cathode and the second auxiliary cathode are formed by using the same material through a single patterning process.

The isolating layer above and the protective layer may be arranged on the same layer. Referring to FIG. 9, the isolating layer 40 may include a first isolating sub-layer 401 and a second isolating sub-layer 402. The first isolating sub-layer and the flat sub-layer of the protective layer may be arranged on the same layer, and the second isolating sub-layer and the insulating sub-layer of the protective layer may be arranged on the same layer, thus reducing steps of the manufacturing process and saving the cost. Referring to FIG. 9, it is illustrated that the isolating layer 40 includes the first isolating sub-layer 401 and the second isolating sub-layer 402.

In this way, in the non-display area, the transparent cathode, the fourth auxiliary cathode, the third auxiliary cathode and the power supply electrode are electrically connected, and then power can be supplied to the transparent cathode through the power supply electrode. In a power supply structure of the transparent cathode, the third auxiliary cathode and the first auxiliary cathode are arranged on the same layer, and the fourth auxiliary cathode and the second auxiliary cathode are arranged on the same layer, so that a new film layer is not additionally arranged, thus reducing the manufacturing cost.

Further, the display substrate above further includes a power line located in the non-emitting area. The power line, the first electrode and the first auxiliary cathode are arranged on the same layer, and both the power line and the first auxiliary cathode are arranged at intervals with the first auxiliary cathode. The power line extends to the non-display area. Moreover, the power line and the third auxiliary cathode are arranged on the same layer and spaced apart from each other. Orthographic projections of the power line and the fourth auxiliary cathode on the base of the display substrate do not overlap with each other.

On one hand, the third auxiliary cathode and the first auxiliary cathode are arranged on the same layer and spaced apart from each other, and the power line, the first auxiliary cathode and the third auxiliary cathode are all arranged on the same layer and spaced apart from each other. In this way, in the non-display area, the third auxiliary cathode is not cross-connected or overlapped with the power line, which can avoid a short circuit between the third auxiliary cathode and the power line. On the other hand, the orthographic projections of the power line and the fourth auxiliary cathode on the base of the display substrate do not overlap with each other. In this way, in the non-display area, the fourth auxiliary cathode is not cross-connected or overlapped with the power line, which can avoid a short circuit between the fourth auxiliary cathode and the power line. Consequently, in the non-display area, the third auxiliary cathode and the fourth auxiliary cathode are not cross-connected or overlapped with the power line, thus avoiding short circuit, and avoiding defects more effectively, thereby ensuring a yield rate of the panel.

Some embodiments of the present disclosure provide a display panel. The display panel includes the display substrate according to the forgoing embodiments.

The display panel may further include a cover board. The cover board is cell-aligned with the display substrate above to form an OLED display panel. In this case, the display substrate may also be called a back board. The display substrate included in the display panel may be provided with an auxiliary cathode without adding a new film layer, thereby reducing the complexity of the manufacturing process and improving the productivity. The display panel may be display devices such as an OLED display, and any product or component with display function such as televisions, digital cameras, mobile phones and tablet computers including these display devices. The display panel may be a large-sized Monitor (display) or TV series.

Figure 10:
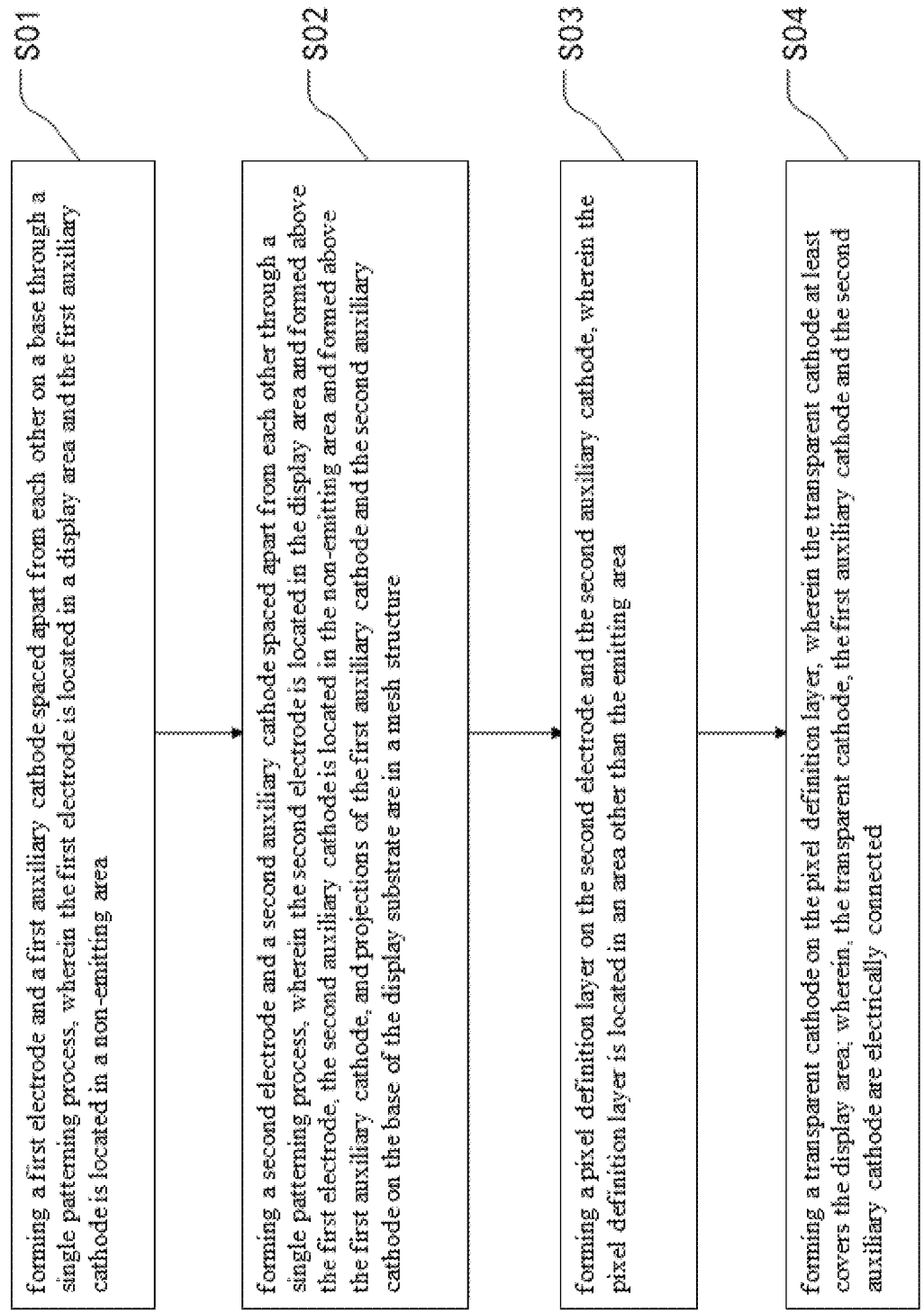
FIG. 10 is a flowchart of a manufacturing method of a display substrate according to an embodiment of the present disclosure.

Some embodiments of the present disclosure provide a manufacturing method of a display substrate. Referring to FIG. 1, the display substrate is divided into a display area (also referred to as Active Area, AA) 20 and a non-display area 21 surrounding the display area 20. The display area 20 includes an emitting area 201 and a non-emitting area 202. Referring to FIG. 10, the manufacturing method of the display substrate includes:

S01. forming a first electrode and a first auxiliary cathode spaced apart from each other on a base through a single patterning process, wherein the first electrode is located in the display area and the first auxiliary cathode is located in the non-emitting area.

Here, a process method specifically used in the patterning process is not limited, for example, the first electrode and the first auxiliary cathode may be formed by a printing process.

S02. forming a second electrode and a second auxiliary cathode spaced apart from each other on the base through a single patterning process, wherein the second electrode is located in the display area and formed above the first electrode, and the second auxiliary cathode is located in the non-emitting area and formed above the first auxiliary cathode; it can be understood that the second electrode and the second auxiliary cathode are arranged on sides of the first electrode and the first auxiliary electrode far away from the base, and projections of the first auxiliary cathode and the second auxiliary cathode on the base of the display substrate are in a mesh structure.

S03. forming a pixel definition layer on the second electrode and the second auxiliary cathode, wherein the pixel definition layer is located in an area other than the emitting area, for example, the pixel definition layer is at least located in the non-emitting area.

S04. forming a transparent cathode on the pixel definition layer, wherein the transparent cathode at least covers the display area, for example, the transparent cathode covers the display area and the non-display area; wherein, the transparent cathode, the first auxiliary cathode and the second auxiliary cathode are electrically connected.

Specific forming methods of the first electrode, the first auxiliary cathode, the second electrode, the second auxiliary cathode, the pixel definition layer and the transparent cathode above are not limited, but may be determined according to actual conditions. For example, the first electrode, the first auxiliary cathode, the second electrode, the second auxiliary cathode, the pixel definition layer and the transparent cathode may all be formed by a printing process. In other words, the display substrate may be manufactured by a full printing process. The display substrate manufactured by using the full printing process has the advantages of long service life, high PPI, less process flow, and the like.

The display area above refers to an area for realizing display. The emitting area refers to an area where an OLED unit is arranged. According to the related art, the OLED unit includes an Anode, an organic emitting functional layer and a Cathode. The non-emitting area refers to an area in the display area except the emitting area. In this area, a pixel definition layer and a pixel circuit unit may be arranged, and the pixel circuit unit may include a Thin Film Transistor (TFT), a grid line, a data line, and the like.

The first electrode above is an essential conductive structure for forming the display substrate. The first electrode may be a source/drain, a grid, an anode, and the like, and may also be a metal line, such as a grid line, a data line, and the like, and is not specifically limited here. The first electrode is located in the display area, that is, a specific area of the first electrode in the display area is not limited, and needs to be determined according to a specific structure of the first electrode. For example, if the first electrode is a data line located in the source-drain electrode layer, the first electrode may be located in the non-emitting area of the display area. If the first electrode is an anode, the first electrode may be located in the emitting area of the display area.

The transparent cathode, the first auxiliary cathode and the second auxiliary cathode above are electrically connected. A specific mode of the electrical connection is not limited here. A material of the transparent cathode above may be a magnesium-silver alloy, and certainly, may further be other material as long as the material has transparent and conductive properties.

The second electrode above is an essential conductive structure for forming the display substrate. The second electrode may be a source/drain, a grid, an anode, and the like, and may also be a metal line, such as a grid line, a data line, and the like, and is not specifically limited here. The second electrode is located in the display area, that is, a specific area of the second electrode in the display area is not limited, and needs to be determined according to a specific structure of the second electrode. For example, if the second electrode is an anode, the second electrode may be located in the emitting area of the display area. In this case, the first electrode may be a data line located in the source-drain electrode layer, which may be located in the non-emitting area of the display area. If the second electrode is a data line located in the source-drain electrode layer, the second electrode may be located in the non-emitting area of the display area. In this case, the first electrode may be a grid line, which may be located in the non-emitting area of the display area.

The embodiments of the present disclosure provide the manufacturing method of the display substrate. In the manufacturing method of the display substrate, the first electrode and the first auxiliary cathode spaced apart from each other are formed on the base through a single patterning process, and the second electrode and the second auxiliary cathode spaced apart from each other are formed on the base through a single patterning process without changing the existing process flow, thereby reducing the complexity of the manufacturing process and improving the productivity. The display substrate formed by the manufacturing method may be provided with an auxiliary cathode on the premise of not adding a new film layer, thereby simplifying the design of the auxiliary cathode and reducing the manufacturing difficulty.

Optionally, S01. the step of, forming the first electrode and the first auxiliary cathode spaced apart from each other on the base through the single patterning process includes:
  forming the first electrode and the first auxiliary cathode spaced apart from each other on the base through a printing process, wherein the first electrode is located in the display area and the first auxiliary cathode is located in the non-emitting area.

The first electrode and the first auxiliary cathode above formed through the printing process are simple in process and strong in operability.

Further optionally, S02. the step of, forming the second electrode and the second auxiliary cathode spaced apart from each other through the single patterning process includes:
  forming the second electrode and the second auxiliary cathode spaced apart from each other through a printing process.

The second electrode and the second auxiliary cathode above formed through the printing process are simple in process and strong in operability.

It should be noted that the structures of the first electrode, the second electrode, the first auxiliary cathode and the second auxiliary cathode are described in detail in the embodiments of the display substrate above, and will not be elaborated herein.

The foregoing descriptions are merely detailed embodiments of the present disclosure, but the protection scope of the present disclosure is not limited thereto. Any person skilled in the art can easily think of changes or substitutions within the technical scope of the present disclosure, and all the changes or substitutions should be covered by the protection scope of the present disclosure. Therefore, the protection scope of the present disclosure should be subject to the protection scope of the claims.

The invention claimed is:

1. A display substrate, comprising a display area and a non-display area surrounding the display area, the display area comprising an emitting area and a non-emitting area, wherein the display substrate comprises:
  a base;
  a first electrode and a first auxiliary cathode arranged on the same layer of the base and spaced apart from each other, wherein the first electrode is located in the display area and the first auxiliary cathode is located in the non-emitting area;
  a second electrode and a second auxiliary cathode arranged on the same layer and spaced apart from each other, and the second electrode and the second auxiliary cathode are arranged on sides of the first electrode and the first auxiliary cathode far away from the base, wherein the second electrode is located in the display area, the second auxiliary cathode is located in the non-emitting area, and orthogonal projections of the first auxiliary cathode and the second auxiliary cathode on the base are in a mesh structure;
  a pixel definition layer, wherein the pixel definition layer is at least located in the non-emitting area, wherein the pixel definition layer is arranged on sides of the second electrode and the second auxiliary cathode far away from the base;

a cathode, wherein the cathode at least covers the display area, and the cathode is arranged on one side of the pixel definition layer far away from the base;

wherein the cathode, the first auxiliary cathode and the second auxiliary cathode are electrically connected;

wherein the first auxiliary cathode comprises a plurality of first auxiliary cathode lines parallel to each other and extending along a first direction, and the second auxiliary cathode comprises a plurality of second auxiliary cathode lines parallel to each other and extending along a second direction, and the first direction intersects with the second direction;

wherein the display substrate further comprises:

a protective layer, wherein the protective layer is at least located in the non-emitting area, and the protective layer is arranged between the first auxiliary cathode and the second auxiliary cathode, and the protective layer is provided with a plurality of protective layer via holes in overlapped areas of the plurality of first auxiliary cathode lines and the plurality of second auxiliary cathode lines, and the plurality of first auxiliary cathode lines are electrically connected to the plurality of second auxiliary cathode lines through the plurality of protective layer via holes.

2. The display substrate according to claim 1, wherein the first direction is perpendicular to the second direction.

3. The display substrate according to claim 1, wherein the pixel definition layer comprises a plurality of first pixel definition layer openings, orthographic projections of the plurality of first pixel definition layer openings on the base fall into an orthographic projection of the second auxiliary cathode on the base, and the cathode is in contact with the second auxiliary cathode lines through the plurality of first pixel definition layer openings.

4. The display substrate according to claim 1, wherein the first electrode is located in the display area, and the first electrode is located in a source-drain electrode layer; and the second electrode is located in the emitting area, and the second electrode is an anode.

5. The display substrate according to claim 4, wherein the display substrate further comprises a power line, wherein the power line, the first electrode and the first auxiliary cathode are arranged on the same layer, and the power line and the first auxiliary cathode are spaced apart from each other.

6. The display substrate according to claim 1, wherein the protective layer comprises an insulating sub-layer and a flat sub-layer arranged far away from the base in sequence.

7. The display substrate according to claim 1, wherein the display substrate further comprises:

a power supply electrode arranged on the base and located in the non-display area, wherein the power supply electrode is configured for supplying power to the cathode; and an inter level dielectric, a third auxiliary cathode, an isolating layer and a fourth auxiliary cathode arranged above the power supply electrode, wherein the power supply electrode, the inter level dielectric, the third auxiliary cathode, the isolating layer and the fourth auxiliary cathode are arranged away far away from the base in sequence, and both the third auxiliary cathode and the fourth auxiliary cathode are located in the non-display area, the power supply electrode is electrically connected to the cathode through the third auxiliary cathode and the fourth auxiliary cathode, and the third auxiliary cathode and the first auxiliary cathode are arranged on the same layer, and the fourth auxiliary cathode and the second auxiliary cathode are arranged on the same layer.

8. The display substrate according to claim 7, wherein the pixel definition layer is provided with a second pixel definition layer opening, an orthogonal projection of the second pixel definition layer opening on the base falls into an orthogonal projection of the fourth auxiliary cathode on the base, the isolating layer is provided with an isolating layer via hole penetrating the isolating layer, the inter level dielectric is provided with an inter level dielectric via hole penetrating the inter level dielectric, and the cathode is in direct contact with the fourth auxiliary cathode through the second pixel definition layer opening; the fourth auxiliary cathode is electrically connected to the third auxiliary cathode through the isolating layer via hole; and the third auxiliary cathode is electrically connected to the power supply electrode through the inter level dielectric via hole.

9. The display substrate according to claim 7, wherein the display substrate further comprises a power line, wherein the power line, the first electrode and the first auxiliary cathode are arranged on the same layer, and the power line and the first auxiliary cathode are spaced apart from each other; and the power line extends from the display area to the non-display area, the power line and the third auxiliary cathode are arranged on the same layer and spaced apart from each other, and orthographic projections of the power line and the fourth auxiliary cathode on the base do not overlap with each other.

10. The display substrate according to claim 7, wherein the display substrate further comprises:

the isolating layer and the protective layer are arranged on the same layer.

11. The display substrate according to claim 10, wherein the isolating layer comprises a first isolating sub-layer and a second isolating sub-layer, and the protective layer includes an insulating sub-layer and a flat sub-layer;

the first isolating sub-layer is arranged on the same layer with the flat sub-layer, and the second isolating sub-layer is arranged on the same layer with the insulating sub-layer.

12. A display panel, comprising the display substrate according to claim 1.

13. The display substrate according to claim 1, wherein the second electrode is located in the display area, the second electrode is located in the source-drain electrode layer, the first electrode is located in the non-emitting area, and the first electrode is a grid line.

14. A manufacturing method of a display substrate, wherein the display substrate is divided into a display area and a non-display area surrounding the display area, the display area comprises an emitting area and a non-emitting area, and the manufacturing method of the display substrate comprises:

forming a first electrode and a first auxiliary cathode spaced apart from each other on a base through a single patterning process, wherein the first electrode is located in the display area and the first auxiliary cathode is located in the non-emitting area;

forming a second electrode and a second auxiliary cathode spaced apart from each other through a single patterning process, wherein the second electrode and the second auxiliary cathode are formed on sides of the first electrode and the first auxiliary cathode far away from the base, the second electrode is located in the display area, and the second auxiliary cathode is located in the non-emitting area; and projections of the first auxiliary cathode and the second auxiliary cathode on the base are in a mesh structure;

forming a pixel definition layer on sides of the second electrode and the second auxiliary cathode far away from the base, wherein the pixel definition layer is at least located in the non-emitting area; and forming a cathode on sides of the pixel definition layer far away from the base, wherein the cathode at least covers the display area, wherein the cathode, the first auxiliary cathode and the second auxiliary cathode are electrically connected;

wherein the first auxiliary cathode comprises a plurality of first auxiliary cathode lines parallel to each other and extending along a first direction, and the second auxiliary cathode comprises a plurality of second auxiliary cathode lines parallel to each other and extending along a second direction, and the first direction intersects with the second direction;

wherein the display substrate further comprises:

a protective layer, wherein the protective layer is at least located in the non-emitting area, and the protective layer is arranged between the first auxiliary cathode and the second auxiliary cathode, and the protective layer is provided with a plurality of protective layer via holes in overlapped areas of the plurality of first auxiliary cathode lines and the plurality of second auxiliary cathode lines, and the plurality of first auxiliary cathode lines are electrically connected to the plurality of second auxiliary cathode lines through the plurality of protective layer via holes.

15. The manufacturing method of the display substrate according to claim 14, wherein the step of, forming the first electrode and the first auxiliary cathode spaced apart from each other on the base through the single patterning process comprises:

forming the first electrode and the first auxiliary cathode spaced apart from each other on the base through a printing process.

16. The manufacturing method of the display substrate according to claim 14, wherein the step of, forming the second electrode and the second auxiliary cathode spaced apart from each other on the base through the single patterning process comprises:

forming the second electrode and the second auxiliary cathode spaced apart from each other on the base through a printing process.

* * * * *